United States Patent [19]
Bradley

[11] Patent Number: 4,901,327
[45] Date of Patent: Feb. 13, 1990

[54] TRANSVERSE INJECTION SURFACE EMITTING LASER

[75] Inventor: Eric M. Bradley, Escondido, Calif.

[73] Assignee: General Dynamics Corporation, Electronics Division, San Diego, Calif.

[21] Appl. No.: 261,413

[22] Filed: Oct. 24, 1988

[51] Int. Cl.[4] .............................................. H01S 3/19
[52] U.S. Cl. ...................................... 372/45; 372/46; 372/47; 372/92
[58] Field of Search ....................... 372/43, 44, 45, 46, 372/92, 108, 47, 49

[56] References Cited

U.S. PATENT DOCUMENTS

| | | | |
|---|---|---|---|
| 3,703,670 | 11/1972 | Kunz | 317/235 |
| 3,983,509 | 9/1976 | Scifres et al. | 331/94.5 |
| 4,309,670 | 1/1982 | Burnham et al. | 331/94.5 |
| 4,512,022 | 4/1985 | Tsang | 372/45 |
| 4,633,476 | 12/1986 | Scifres et al. | 372/45 |
| 4,644,553 | 2/1987 | Van Ruyven et al. | 372/46 |
| 4,660,207 | 4/1987 | Svilans | 372/45 |
| 4,665,527 | 5/1987 | Akiba et al. | 372/96 |
| 4,675,875 | 6/1987 | Takamiya | 372/45 |
| 4,675,876 | 6/1987 | Svilans | 372/96 |
| 4,675,877 | 6/1987 | Svilans | 372/96 |
| 4,706,101 | 11/1987 | Nakamura et al. | 372/46 |
| 4,760,578 | 7/1988 | Oshima et al. | 372/108 |
| 4,797,890 | 1/1989 | Inaba et al. | 372/46 |

FOREIGN PATENT DOCUMENTS 0004291 1/1986 Japan ...................................... 372/46

OTHER PUBLICATIONS

Room-Temperature Pulsed Oscillation of GaAlAs/-GaAs Surface Emitting Injection Laser by K. Iga et al., App. Physics Letters, vol. 45, (No. 10 pp. 348-350, Aug. 15, 1984).
High Reflectivity GaAs-AlGaAs Mirrors Fabricated by Metalorganic Chemical Vapor Deposition by R. L Thornton et al., Applied Physics Letters, vol. 45, No. 10, pp. 1028-1030, Nov. 15, 1984.
Surface-Emitting Laser Diode with Vertical GaAs,-GaAlAs Quarter-Wavelength Multilayers and Lateral Buried Heterostructure by Mutsuo Ogura et al., Applied Physics Letters, vol. 51, No. 21, pp. 1655-1657 Nov. 23, 1987.

Primary Examiner—James W. Davie
Attorney, Agent, or Firm—Brown, Martin, Haller & McClaim

[57] ABSTRACT

A semiconductor laser for emitting light transverse to the direction of current injection. The laser is fabricated from a substrate having planar top and bottom surfaces and an aperture formed therebetween. An optical cavity, formed upon the substrate top surface and aligned with the aperture, has co-planar top and bottom surfaces with dielectric mirrors formed thereupon. Contacts are formed adjacent the optical cavity for conducting current through the optical cavity in a direction substantially parallel to the optical cavity top and bottom surfaces. Current confinement layers are disposed in intimate contact with the optical cavity for confining current flowing in the optical cavity along a predetermined path extending between the contacts.

16 Claims, 3 Drawing Sheets

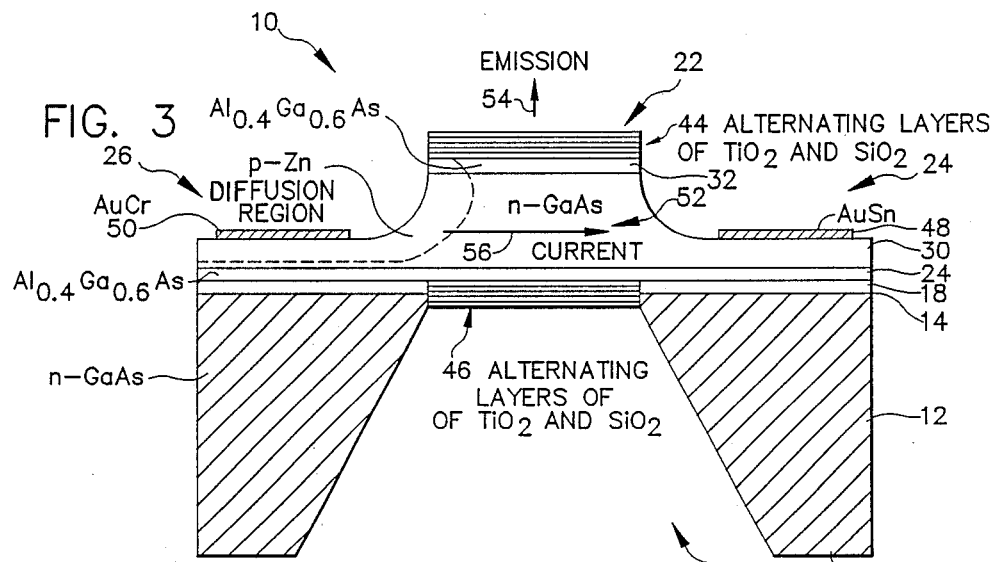
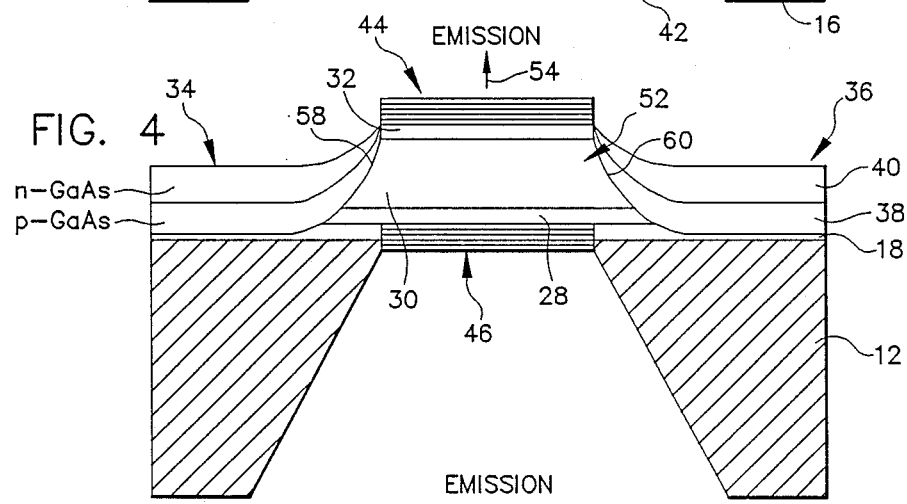
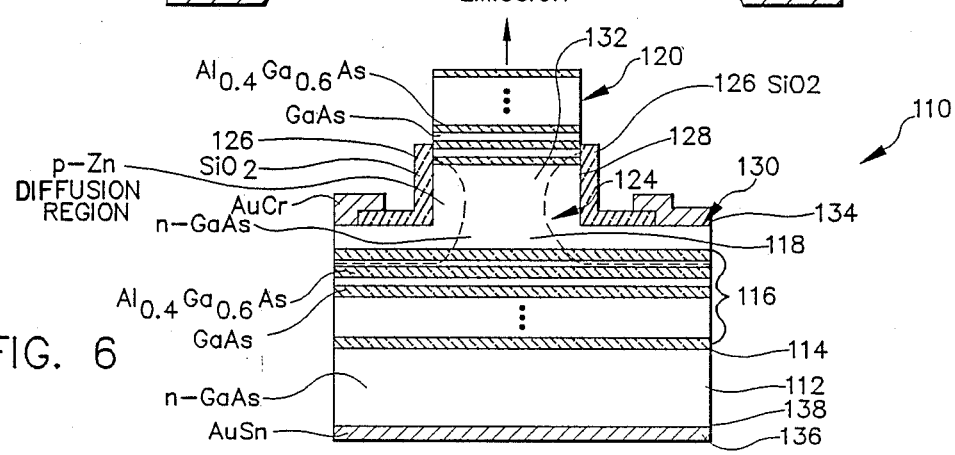

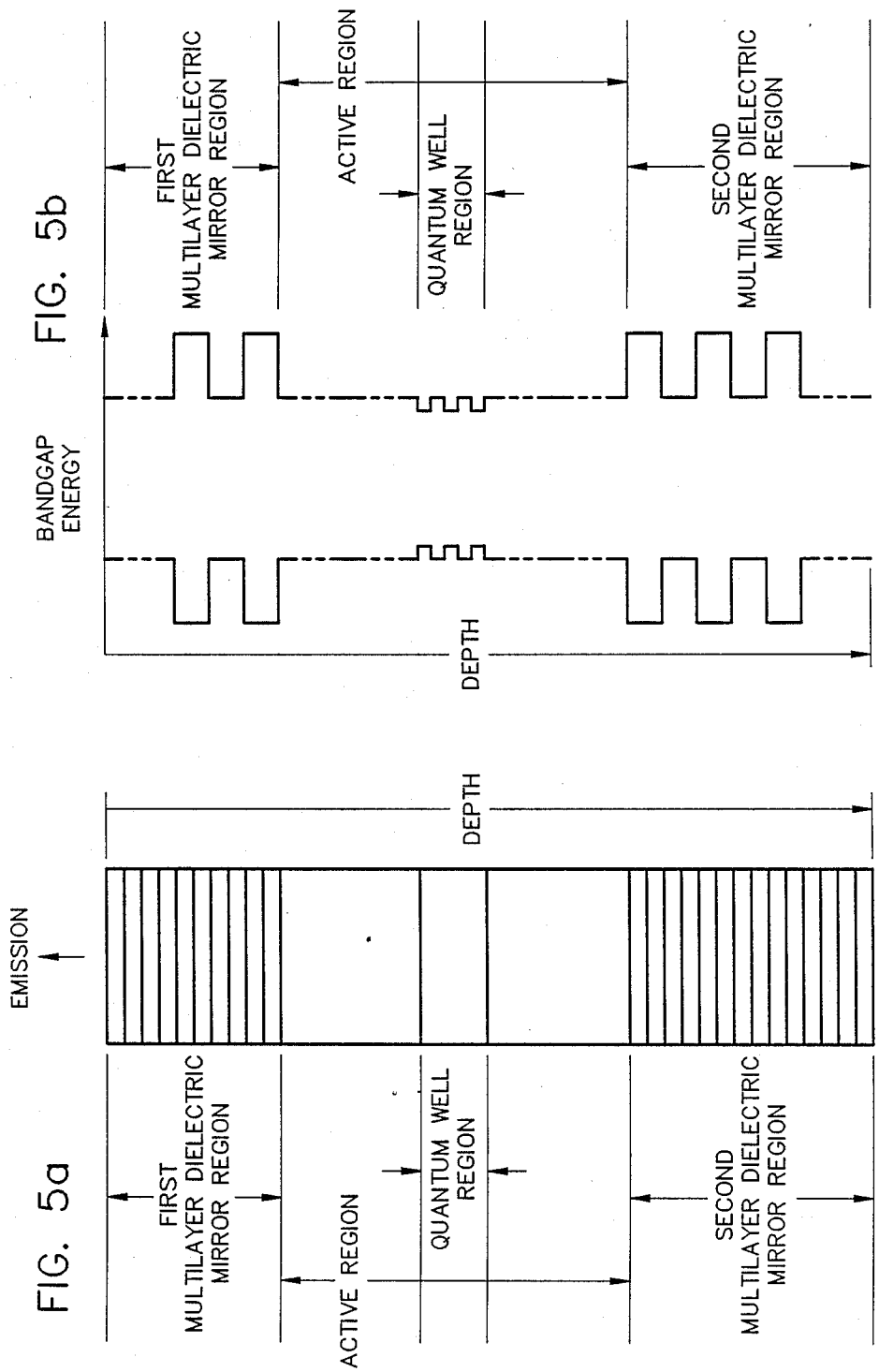

TRANSVERSE INJECTION SURFACE EMITTING LASER

BACKGROUND OF THE INVENTION

I. Field of the Invention

The present invention relates to semiconductor lasers. More particularly, the present invention relates to a novel and improved surface emitting laser wherein injection is achieved transverse to the direction of light propagation.

II. Description of the Related Art

Conventional semiconductor lasers are configured for emitting light from an edge-cleaved facet of the device. Recently, research has been conducted on surface emitting lasers (SELs) which emit light from a top or bottom surface of the device. Surface emitting lasers have an inherently distinct advantage over conventional edge emitting lasers in that the surface emitting lasers are readily adaptable for coupling to other optical components.

Research into the area of surface emitting lasers has resulted in the development of devices of various structures for emitting light from either a top or bottom surface of the device. In several of the previously known devices, carrier injection is achieved transversed to the direction of light propagation. However, many of these devices configured for transverse injection have high threshold current levels at which lasing occurs. The existence of a high threshold current level in a device is typically the result of the structure lacking transverse confinement of electrons and photons. A device having a high threshold current level is a device which is highly inefficient. A device lacking adequate confinement of electrons and photons results in overheating of the device due to the excessive current needed to drive the device to lasing. Accordingly, in low power requirement applications where temperature considerations are important, such inefficient devices may not be utilized.

One example of a surface emitting laser is disclosed in the publication "Room-Temperature Pulsed Oscillation of GaAlAs/GaAs Surface Emitting Injection Laser," Iga et al., Applied Physics Letters, Vol. 45, No. 4, pgs. 34814 350 (1984). This publication discloses a surface emitting laser in which the cavity mirrors are formed by metalization, or a layer of $SiO_2$ with metalization on top of the $SiO_2$ layer. Carrier injection is achieved parallel to the pn junction with injection on the p-side of the device through the p-side mirror metalization. Utilizing this structure, threshold currents as low as 6 miliamps have been achieved with acceptable lasing output. However, this structure uses the p-side mirror to also function as an injecting contact. In order for the p-side mirror to act as an injecting contact, the metalization must be annealed to form an alloyed contact. The annealing process can result in poor mirror performance, primarily due to the absorption/scattering in the thin alloyed region formed beneath the metal layer. Implementation of a non-alloyed injecting contact can result in adverse local heating in the contact region during operation of the laser. Local heating in the contact region can alloy the contact and produce a drop in mirror reflectivity. A drop in mirror reflectivity can result in unstable laser performance.

Another example of a surface emitting laser is disclosed in the publication "Surface Emitting Laser Diode with Vertical GaAs/GaAlAs Quarter-Wavelength Multilayers and Lateral Buried Heterostructure," Ogura et al, Applied Physics Letters, Vol. 51, No. 21, pgs. 1655-1657 (1987). This publication discloses a lateral buried heterostructure laser in which a vertical distributed feedback active region is comprised of a quarter-wavelength stack of AlGaAs and GaAs layers that is surrounded with n-type and p-type AlGaAs cladding layers. This particular structure does provide enhanced carrier confinement with a threshold current realized as low as 2 mA. However, this particular structure exhibits a broad lasing spectrum with satellite emissions. This particular structure is fabricated such that a diffusion process is performed after fabrication of the structure mirrors. As such, the diffusion process may adversely affect mirror performance.

SUMMARY OF THE INVENTION

The present invention comprises a novel and improved surface emitting laser. In one embodiment of the invention, a substrate is utilized having planar top and bottom surfaces and an aperture formed therebetween. An optical cavity is formed upon the substrate top surface and aligned with the aperture. The optical cavity has substantially coplanar top and bottom surfaces with a dielectric mirror formed upon the optical cavity top surface and upon the optical cavity bottom surface within the aperture. Contact means are included for conducting current through the optical cavity in a direction substantially parallel to the optical cavity top and bottom surfaces. Current confinement means are also included and are disposed in intimate contact with the optical cavity for confining current flowing in the optical cavity along a predetermined path extending between the contact means.

It is, therefore, an object of the present invention to provide a novel and improved surface emitting laser.

It is yet another object of the present invention to provide a low power, room temperature operating surface emitting laser utilizing a high reflectivity mirror structure.

BRIEF DESCRIPTION OF THE DRAWINGS

These and other features, objects, and advantages of the present invention will become more fully apparent from the detailed description set forth below when taken in conjunction with the drawings in which like reference characters identify correspondingly throughout and wherein:

FIG. 3 is a sectional view taken across line 3—3 of the surface emitting laser of FIG. 2;

FIG. 4 is a sectional view taken across line 4—4 of the surface emitting laser of FIG. 2;

FIG. 5a illustrates a schematic cross-section of the surface emitting laser mirror and active regions with a quantum well region formed; the active region in FIG. 5b is a graph illustrating the bandgap energy distribution corresponding to the schematic cross-section of FIG. 5a; and FIG. 6 is an alternate embodiment of a surface emitting laser of the present invention.

DETAILED DESCRIPTION OF THE PREFERRED EMBODIMENTS

The present invention comprises a novel and improved surface emitting laser utilizing transverse carrier injection into the active region of the optical cavity. In general, one embodiment of the present invention reveals a surface emitting laser that is similar in structure to a conventional buried heterostructure laser. However, the structure of the one embodiment of the present invention differs in that a transverse masking stripe is deposited perpendicular to the lateral mesa stripe and then chemically etched. The resulting structure reveals a central portion of the lateral mesa stripe remaining at the original height while the end portions of the lateral mesa stripe have been chemically etched to a lower thickness. An additional masking stripe is placed over one end portion of the lateral mesa stripe and extending up one side of the central portion of the lateral mesa stripe. A diffusion process is then performed at the unmasked portion of the lateral mesa stripe. Subsequently, the masking stripes are removed. Contacts are formed at the lateral mesa stripe end portions by depositing metal thereupon. A hole is then chemically etched through the substrate from the substrate backside, with the hole aligned with the central portion of lateral mesa stripe. Dielectric mirrors are then formed within the hole and on top of the mesa central portion.

Figure 1:
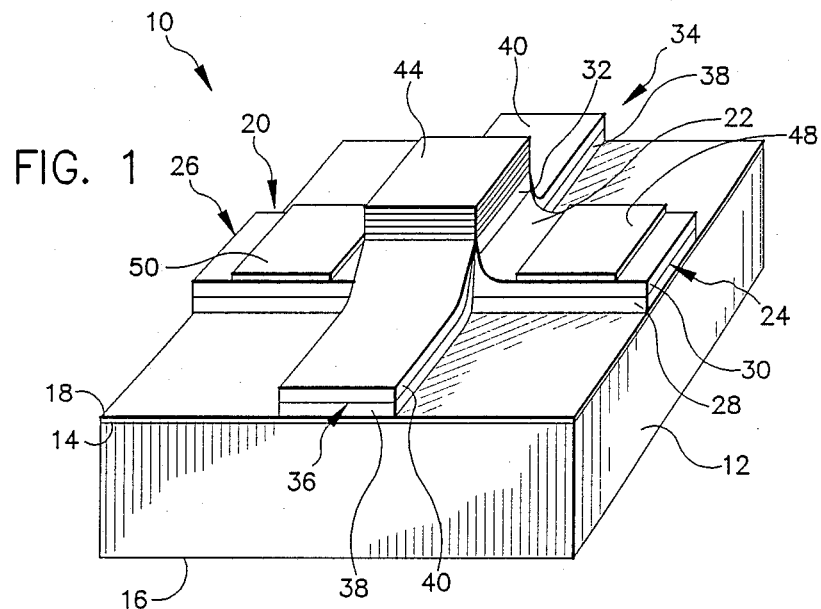
FIG. 1 is a perspective view of one embodiment of a surface emitting laser constructed in accordance with teachings of the present invention.
Figure 2:
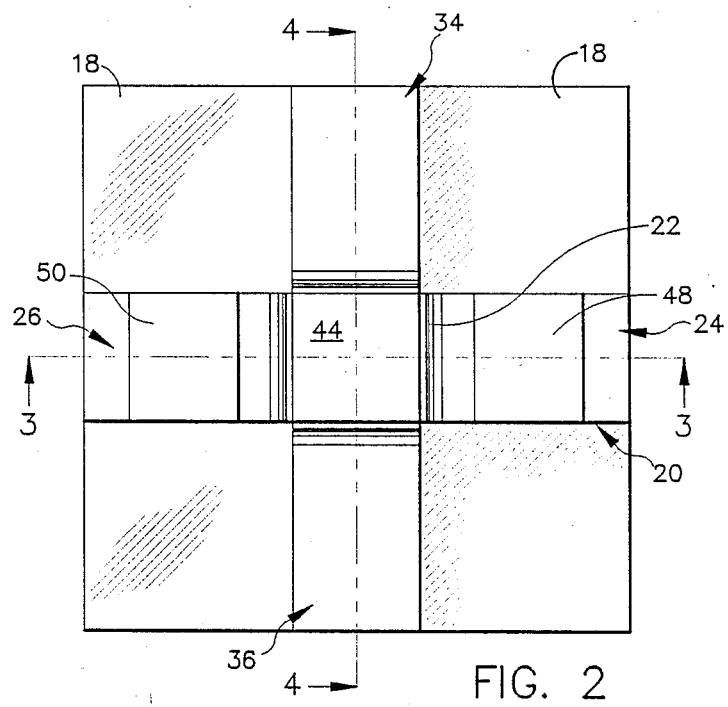
FIG. 2 is a top plan view of the surface emitting laser of FIG. 1.

FIGS. 1 and 2 respectively illustrate one embodiment of the present invention in perspective and top plan views. The structure of surface emitting laser 10 is formed upon an n-type GaAs substrate 12. Substrate 12 has top and bottom surfaces respectively identified by the reference numerals 14 and 16. Generally, substrate 12 is prepared for use at top surface 14 for the fabrication of a device upon substrate top surface 14 by forming a buffer layer 18 thereupon. As is well known in the art, a buffer layer is formed upon a substrate top surface to overcome surface imperfections. Substrate top surface 14 is typically prepared by cleaning and polishing techniques prior to the formation of buffer layer 18 thereupon Buffer layer 18 is typically formed by growing a layer of lattice matched semiconductor material upon substrate top surface 14. In the present embodiment, buffer layer 18 is typically formed by growing a layer approximately 1.0 μm thick n-type GaAs upon substrate top surface 14. In an alternative method, rather than forming a buffer layer by regrowth techniques, the substrate may be chemically etched at one surface to form a top surface upon which the surface emitting laser may be fabricated.

FIGS. 1 and 2 further illustrate lateral mesa stripe 20 which is comprised of a central portion 22 and a pair of end portions 24 and 26 formed upon buffer layer 18. Lateral mesa stripe central portion 22 extends above buffer layer 18 at a height greater than lateral mesa stripe end portions 24 and 26 which extend outwardly therefrom upon buffer layer 18. Lateral mesa stripe 20 is constructed from a barrier layer 28 formed upon buffer layer 18, an active layer 30 formed upon barrier layer 28, and another barrier layer 32 formed upon active layer 30. Barrier layer 32 and active layer 30 are chemically etched during the fabrication of surface emitting laser 10 to define lateral mesa stripe end portions 24 and 26. However, lateral mesa stripe central portion 22 is defined by an unetched portion of barrier layer 28, active layer 30 and barrier layer 32.

Transverse stripes 34 and 36 are formed upon buffer layer 18 and extend outwardly upon buffer layer 18 substantially perpendicular to lateral mesa stripe 20. Transverse stripes 34 and 36 abut against the sides of lateral mesa stripe central portion 22. Transverse stripes 34 and 36 are comprised of a first confinement layer 38 formed upon buffer layer 18 which extends up the side walls of lateral mesa stripe 20. A second confinement layer 40 is formed upon layer 38. Portions of first and second confinement layers 38 and 40 are masked, then chemically etched to define transverse stripes 34 and 36.

Hole 42 (FIG. 3) is formed in substrate 12, at substrate bottom surface 16, which extends through substrate 12 perpendicular to the plane of substrate bottom surface 16. Hole 42 is aligned with lateral mesa stripe central portion 22. Thus, hole 42 exposes barrier layer 28 within the region defining lateral mesa stripe center portion 22. Mirror 44, comprised of alternating layers of different refractive index dielectric materials, is formed upon barrier layer 32 in the region defined as lateral mesa stripe central portion 22. Similarly, mirror 46, also comprised of alternating layers of different refractive index materials, is formed upon barrier layer 28 in the region defined as lateral mesa stripe central portion 22 within hole 42.

Surface emitting laser 10 has formed upon substrate 12 barrier layer 28 which is typically comprised of undoped $Al_{0.4}Ga_{0.6}As$ of a typical thickness in the range of 1,000–2,000 A. Formed on top of barrier layer 28 is active layer 30 which is an n-type layer of GaAs preferably in the range of approximately 2–3μm in thickness. The lower portion of active layer 30, adjacent barrier layer 28, is heavily doped in n-type carrier concentration while the top portion is of more moderate n-type carrier concentration. Formed on top of active layer 30 is another barrier layer 32 of undoped $Al_{0.4}Ga_{0.6}As$ also of a thickness in the range of approximately 1,000–2,000 A. The material forming barrier layers 28 and 32 is of a higher bandgap, but lattice matched to the material of active layer 30.

In forming lateral mesa stripe 20, a lateral masking stripe (not shown) is placed on top of layer 32. The unmasked portions of barrier layer 32 and the corresponding underlying portions of active layer 30 and barrier layer 28 are then chemically etched down to buffer layer 18, or if buffer layer 18 is not present then to substrate 12. Chemical etching of the unmasked portions of barrier layers 28 and 32, and active layer 30 thus defines lateral mesa stripe 20 beneath the lateral masking stripe. First confinement layer 38, comprised of lightly doped p-type $Al_{0.4}Ga_{0.6}As$ of a thickness approximately 1.0 μm, is then formed upon buffer layer 18 and the sides of lateral mesa stripe 20. Formed on top of, first confinement layer 38 is second confinement layer 40 which is comprised of lightly doped n-type $Al_{0.4}Ga_{0.6}As$ of a thickness of approximately 1.0 μm. The lateral masking stripe is then removed and a transverse masking stripe (not shown) is positioned upon second confinement layer 40. The transverse masking stripe is positioned perpendicular to lateral mesa stripe 20 and is centrally oriented along the length of lateral mesa stripe 20. The unmasked portions of second confinement layer 40 and the corresponding underlying portions of first confinement layer 38 are chemically etched down to buffer layer 18. In addition, the unmasked portion of lateral masking stripe 20 is etched down into the heavily doped n-type portion of active layer 30. As a result of this chemical etching, the lateral mesa central stripe central portion 22 and end portions 24 and 26 are thus defined. Lateral mesa stripe central portion 22 is located beneath the transverse masking stripe and appears as a raised portion of lateral masking stripe 20. Lateral mesa stripe central portion 22, as formed, is approximately 2.0 μm in length and width.

A diffusion masking stripe (not shown) is then placed upon lateral mesa stripe end portion 24, including the immediately adjacent side of lateral mesa stripe central portion 22 facing lateral mesa stripe end portion 24. A diffusion process is then performed so as to form a heavily doped p-type Zn diffusion region at the exposed side of lateral mesa stripe central portion 22 immediately adjacent lateral mesa stripe end portion 26 and along lateral mesa stripe end portion 26. The transverse masking stripe and the diffusion masking are then removed.

Contacts or electrodes are then formed by depositing metal upon the top surface of active layer 30 in the lateral mesa stripe end portions 24 and 26. An AuSn metalization is performed at lateral mesa stripe end portion 24 so as to form contact 48. Similarly, an AuCr metalization is performed upon lateral mesa stripe end portion 26 so as to form contact 50.

Hole 42 (FIG. 3) is chemically etched from the underside of substrate 12 through substrate 12 and buffer layer 18, if present, to barrier layer 28. Hole 42 is centered under the lateral mesa stripe central portion 22. Mirrors 44 and 46 are then formed by depositing alternating layers of dielectric materials, such as $TiO_2$ and $SiO_2$, upon the remaining portion of barrier layer 32 at lateral mesa stripe central portion 22, and within hole 42 upon barrier layer 28. Mirrors 44 and 46 are sometimes referred to in the art as distributed Bragg reflectors. By depositing mirrors 44 and 46 respectively upon barrier layers 32 and 28 after the diffusion into active layer 30 avoids damaging the mirrors during the diffusion process.

Although surface emitting laser 10 is described with particular reference to semiconductor materials such as GaAs and $Al_{0.4}Ga_{0.6}As$, it is well known that other types of semiconductor materials may be utilized. For example, the substrate may be InP, the high bandgap barrier layers InP, and the active layer InGaAsP.

FIG. 3 illustrates surface emitting laser 10 in a sectional view taken across line 3—3 of FIG. 2. In FIG. 3, mirror 46 is formed upon barrier layer 28 within hole 46, while mirror 44 is formed upon barrier layer 32. A laser active region or optical cavity 52 is defined by active layer 30 within lateral mesa stripe central portion 22 between dielectric mirrors 44 and 46. The combination of mirrors 44 and 46 formed on opposite sides of optical cavity 52 define a resonant optical cavity. Current passing through the optical cavity between contacts 48 and 50 is transverse to the direction of light emission from surface emitting laser 10. The light emission from surface emitting laser 10 is indicated by arrow 54. Current passing through optical cavity 52 during operation of surface emitting laser 10 is indicated by arrow 56. Light emission from surface emitting laser 10 is thus essentially perpendicular to a plane defined by substrate top surface 14.

In the first embodiment, it is preferred that mirrors 44 and 46 be formed from dielectric materials, although other semiconductor materials may be used, as is well known in the art. Mirrors formed of alternating layers of dielectric materials of differing refractive indices are known to be capable of reflectivities exceeding 99.9%. It is further preferred that a thin layer of higher bandgap lattice matched material, i.e., barrier layers 28 and 32, be grown between the lasing medium, i.e., active region or optical cavity 52, to provide current confinement away from the active region/mirror interface. Implementation of the barrier layers avoids carrier recombination at surface states and imperfections at the active region/mirror interface.

Light emission may occur from either mirror. In order to facilitate light emission from one mirror, a lesser number of dielectric layer pairs are deposited upon the barrier layer to form the mirror from which light is to be emitted. When utilizing dielectric mirrors, it is preferred that the total number of dielectric layer pairs be in the range of 20-30.

FIG. 4 illustrates surface emitting laser 10 in a sectional view taken along line 4—4 of FIG. 2. The view in FIG. 4 is taken looking along the direction of current flow in the optical cavity 52. FIG. 4 illustrates in further detail the regrown first and second confinement layers 38 and 40 of transverse stripes 34 and 36 which abut against sides 58 and 60 of lateral mesa stripe 20 in the region of lateral mesa stripe central portion 22. Transverse stripes 34 and 36 extend outwardly perpendicularly from sides 58 and 60 upon buffer layer 18. First confinement layer 38 of transverse stripes 34 and 36 is a lightly doped p-type $Al_{0.4}Ga_{0.6}As$ layer that is formed upon buffer layer 18, and along the sides of barrier layer 32, active layer 30 at optical cavity 52, and barrier layer 36. Second confinement layer 40 is a lightly doped n-type $Al_{0.4}Ga_{0.6}As$ layer that overlies first confinement layer 38. First and second confinement layers 38 and 40 are integrally formed against optical cavity 52 so as to function as a reverse bias junction. Accordingly, first and second confinement layers 38 and 40 effectively block current from flowing around the sides or edges of optical cavity 52.

In the structure as illustrated in FIGS. 1-4, injection is achieved transverse to the direction of light propagation. Accordingly, in the structure of the invention described with reference to FIGS. 1-4, there is no need to form an injecting contact at a p-side mirror as in the structure disclosed in the previously referenced article of Iga et al. Furthermore, the p-type diffusion in the active layer is performed prior to mirror fabrication, thus avoiding mechanical deformation of the mirrors. Utilizing a cavity of length 2-3 μm will produce a more widely spaced longitudinal mode resulting in increased stability in single longitudinal mode operation. The structure of the surface emitting laser disclosed with reference to FIGS. 1-4 may be constructed using epitaxy techniques well known in the art. These techniques include molecular beam epitaxy (MBE) or metalorganic chemical vapor deposition (MOCVD) and are known for accuracy and reproducibility in the growing of layers on the order of 1,000Å or less.

It is further envisioned that during the fabrication of active layer 30, particularly in optical cavity 52 of the lateral mesa stripe central portion 22, quantum wells may be introduced therein. Quantum wells are formed in the active layer by "shuttering" or selectively introducing an aluminum component, along with the Ga and As components during the epitaxy technique formation of the active layer.

The introduction of quantum wells into the optical cavity active layer will lower the lasing threshold current, due to the reduced density of states in the wells. Quantum wells formed in the optical cavity active layer also increase the wavelength of emission, due to the reduced bandgap in the active layer. Increased emission wavelength will thus allow the lowest bandgap in the multilayer dielectric mirrors to be lowered. A reduction in the lowest bandgap in the multilayer dielectric mirrors will permit the index of refraction to increase and thus improve the reflectivity of the mirrors.

FIG. 5a is a schematic diagram of an active region structure similar to the embodiment of FIGS. 1-4 while incorporating a quantum well region while disregarding the barrier layers. FIG. 5b is a graph illustrating the corresponding bandgap energy versus depth for the structure in FIG. 5a.

FIG. 6 illustrates an alternate embodiment of the present invention constructed using MBE or MOCVD techniques. Use of these techniques enables the growth of semiconductor mirrors in alternating layers of high and low index materials which are lattice matched to the substrate and/or active layer. FIG. 6 illustrates, in cross-section, surface emitting laser 110. Surface emitting laser 110 is comprised of an n-type GaAs substrate 112 which typically includes a buffer layer (not shown) formed at surface 114. Alternating layers of $Al_{0.6}Ga_{0.4}As$ and GaAs are sequentially grown upon the substrate top surface 114 or buffer layer, if included, to form a multilayer semiconductor mirror or distributed Bragg reflector 116. The laser active region is formed by growing an n-type GaAs active layer 118 in the range of 2-3 $\mu$m thick on top of mirror stack 116. Alternating layers of $Al_{0.4}Ga_{0.6}As$ and GaAs are formed on top of active layer 118 to form a multilayer mirror or distributed Bragg reflector 120.

A mesa is then formed in the structure typically by first forming a circular mask on top of mirror 120. The unmasked portion of mirror 116, and the underlying portion of active layer 118, is chemically etched to leave mesa 122. A diffusion region 124 is then formed about the side of mesa 122 and in the thinner outer portion of active layer 118 adjacent mesa 122. Diffusion region 124 is formed by diffusing p-type Zn in the active layer 118.

Dielectric layer 126, typically formed from a material such as $SiO_2$, is deposited on side 128 of mesa 122 at active layer 118 while overlapping a portion of mirror 120. Dielectric layer 126 extends radially outwardly from mesa 122 upon exposed top surface 130 of active layer 118 immediately adjacent mesa 122. The refractive index of the dielectric material is chosen to match that of active region 132, i.e. the portion of active layer 118 within mesa 122, so as to reduce the effects of optical scattering at the boundary thereof. In the alternative, dielectric layer 126 may be replaced by a regrowth of a higher bandgap lattice matched p-type GaAs layer about mesa 122 followed by the regrowth of a n-type layer of GaAs.

Contact 134 is formed by a AuCr metalization upon the remaining exposed top surface 130 of active layer 118, with the metalization overlapping dielectric layer 126. Contact 136 is formed of AuSn metalization upon substrate bottom surface 138.

The previous description of the preferred embodiments are provided to enable any person skilled in the art to make or use the present invention. Various modifications to these embodiments will be readily apparent to those skilled in the art, and the generic principles defined herein may be applied to other embodiments without the use of the inventive faculty. Thus, the present invention is not intended to be limited to the embodiments shown herein, but is to be accorded the widest scope consistent with the principles and novel features disclosed herein.

I claim:

1. A surface emitting laser comprising:
   a semiconductor substrate having planar top and bottom surfaces and an aperture formed therebetween;
   a semiconductor optical cavity formed upon said substrate top surface and aligned with said aperture, said optical cavity having substantially coplanar top and bottom surfaces;
   first and second dielectric mirrors, said first dielectric mirror formed upon said optical cavity top surface and said second dielectric mirror formed upon said optical cavity bottom surface within said aperture;
   contact means for conducting current through said optical cavity in a direction substantially parallel to said optical cavity top and bottom surfaces; and
   current confinement means disposed in intimate contact with said optical cavity for confining current flowing in said optical cavity along a predetermined path extending between said contact means.

2. The surface emitting laser of claim 1 wherein said optical cavity comprises:
   a central portion of a first barrier layer strip disposed upon said substrate;
   a central portion of an n-type active layer strip disposed upon said first barrier layer strip, said active layer central portion overlying said first barrier layer central portion and having a p-type region formed therein;
   a second barrier layer strip disposed upon said active layer strip central portion; and
   wherein said first and second barrier layer strips are of a semiconductor material having a higher energy bandgap than said active layer strip.

3. The surface emitting laser of claim 2 wherein said contact means comprises:
   first and second end portions of said first barrier layer strip located at opposite ends thereof;
   first and second end portions of said active layer strip respectively overlying said first barrier layer strip first and second end portions, said active layer strip first end portion having a p-type region integrally formed therein with said active layer strip central portion p-type region; and
   first and second metalizations respectively disposed upon said active layer strip first and second end portions with said first metalization in intimate contact with said active layer strip first end portion p-type region.

4. The surface emitting laser of claim 2 wherein said current confinement means comprises:
   first and second p-type semiconductor confinement layer strips respectively disposed on said substrate on opposite sides of said optical cavity, said first and second p-type confinement layer strips abutting against opposite sides of said first barrier layer strip central portion, said active layer strip central portion and said second barrier layer strip; and
   first and second n-type confinement layer strips respectively disposed upon said first and second p-type confinement layer strips.

5. The surface emitting laser of claim 3 wherein said current confinement means comprises:
   first and second p-type semiconductor confinement layer strips respectively disposed on said substrate on opposite sides of said optical cavity transverse to said first barrier layer strip, said first and second p-type confinement layer strips abutting against opposite sides of said first barrier layer strip central portion, said active layer strip central portion and said second barrier layer strip; and first and second n-type semiconductor confinement layer strips respectively disposed upon said first and second p-type confinement layer strip.

6. The surface emitting laser of claim 1 wherein said optical cavity further comprises at least one quantum well formed therein.

7. The surface emitting laser of claim 2 wherein said substrate is formed of GaAs; said first and second barrier layer strips are formed of $Al_{0.4}Ga_{0.6}As$; and said active layer strip is formed of GaAs.

8. The surface emitting laser of claim 7 wherein said active layer strip central and first end portion p-type regions are formed of a Zn diffusion; and said first and second p-type confinement layer strips and said first and second n-type confinement layer strips are formed of $Al_{0.4}Ga_{0.6}As$.

9. The surface emitting laser of claim 1 wherein each of said top and bottom dielectric mirror are formed of alternating layers of dielectric materials having differing indices of refraction.

10. A surface emitting laser for emitting light at a predetermined wavelength in a direction transverse to current flow through the laser comprising:

a semiconductor substrate having top and bottom surfaces and a hole extending between said top and bottom surfaces;

a semiconductor lateral mesa stripe formed upon said substrate top surface, said lateral mesa stripe having a pair of end portions each having a contact formed thereupon, and a raised central portion aligned with said hole and having exposed top and bottom surfaces;

current confinement means formed upon said substrate top surface abutting against said central portion; and first and second dielectric mirrors each respectively formed upon said central portion top and bottom surfaces, each of said first and second dielectric mirrors having a plurality of pairs of dielectric layers with each layer in each layer pair of a differing refractive index.

11. The surface emitting laser of claim 10 wherein said current confinement means comprises first and second semiconductor transverse current confinement stripes respectively formed upon said substrate on opposite sides of said lateral mesa stripe at and abutting said central portion.

12. The surface emitting laser of claim 10 wherein said lateral mesa stripe comprises:

a first barrier layer strip formed upon said substrate;

an n-type active layer strip formed upon said first barrier layer strip, said active layer being greater in thickness at said central portion than said end portions, and having a p-type region integrally formed within said central portion and one of said end portions with one of said contacts in intimate contact with said p-type region at said one end portion; and a second barrier layer strip formed upon said active layer strip at said central portion.

13. The surface emitting laser of claim 11 wherein said lateral mesa stripe comprises:

a first barrier layer strip formed upon said substrate;

an n-type active layer strip formed upon said first barrier layer strip, said active layer being greater in thickness at said central portion than said end portions, and having a p-type region integrally formed within said central portion and one of said end portions with one of said contacts in intimate contact with said p-type region at said one end portion; and a second barrier layer strip formed upon said active layer strip at said central portion.

14. The surface emitting laser of claim 12 wherein each of said first and second current confinement means comprises:

a p-type confinement layer strip formed upon said substrate and a side of said first barrier layer strip, said active layer strip and said second barrier layer at said central portion; and an n-type confinement layer strip formed upon said p-type confinement layer strip.

15. The surface emitting laser of claim 10 wherein said central portion further comprises at least one quantum well formed therein.

16. The surface emitting laser of claim 12 wherein said active layer strip in said central portion further comprises a plurality of quantum wells formed therein.

* * * * *